United States Patent
Ruffieux

(10) Patent No.: US 6,696,899 B2
(45) Date of Patent: Feb. 24, 2004

(54) DIFFERENTIAL OSCILLATOR CIRCUIT INCLUDING AN ELECTRO-MECHANICAL RESONATOR

(75) Inventor: David Ruffieux, Belfaux (CH)

(73) Assignee: CSEM, Centre Suisse d'Electronique et de Microtechnique sa Recherche et Development, Neuchatel (CH)

(*) Notice: Subject to any disclaimer, the term of this patent is extended or adjusted under 35 U.S.C. 154(b) by 0 days.

(21) Appl. No.: 10/162,714

(22) Filed: Jun. 6, 2002

(65) Prior Publication Data

US 2002/0190802 A1 Dec. 19, 2002

(30) Foreign Application Priority Data

Jun. 7, 2001 (EP) .............................. 01202173

(51) Int. Cl.[7] ................................. H03L 5/00
(52) U.S. Cl. .................. 331/154; 331/158; 331/116 R; 331/107 A; 331/143; 368/159
(58) Field of Search ............................. 331/158, 116 R, 331/107 A, 154, 143; 310/311, 313 R; 368/156, 159

(56) References Cited

U.S. PATENT DOCUMENTS

| | | | |
|---|---|---|---|
| 4,588,968 A | 5/1986 | Wile | |
| 5,469,116 A | 11/1995 | Slemmer | |
| 5,999,062 A | 12/1999 | Gilbert | |
| 6,525,609 B1 * | 2/2003 | Behzad | 330/254 |

FOREIGN PATENT DOCUMENTS

| | | |
|---|---|---|
| DE | 43 31 499 A1 | 3/1995 |
| EP | 335 493 A2 | 10/1989 |
| WO | WO 98/48511 A1 | 10/1998 |

OTHER PUBLICATIONS

Resonance—Mode Selection & Crosstalk Elimination Using Resonator—Synchronized Relaxation Oscillators by J.R. Westra et al., Delft Univ. of Tech., pp. 88–91, Sep. 1998.

* cited by examiner

Primary Examiner—Arnold Kinkead
(74) Attorney, Agent, or Firm—Sughrue Mion, PLLC

(57) ABSTRACT

There is disclosed a differential oscillator circuit including first (10) and second (20) branches each including the series arrangement, between high (VDD) and low (VSS) supply potentials, of a first transistor (4, 5), a first current source (2, 3) and resistor means (**8, 9, 18, 19; 18\*, 19\***). The first transistors are interconnected so as to form a crossed pair of transistors, the most positive current terminal of each transistor (on the "drain" side) being connected to the control terminal of the other transistor of the crossed pair.

This differential oscillator circuit further includes an electro-mechanical resonator (6) connected to the crossed transistor pair on the "drain" side, as well as a capacitive element (7) connected to the crossed transistor pair on the "source" side.

Advantageously, for high frequency applications, the electro-mechanical resonator can be of the bulk acoustic wave type.

12 Claims, 4 Drawing Sheets

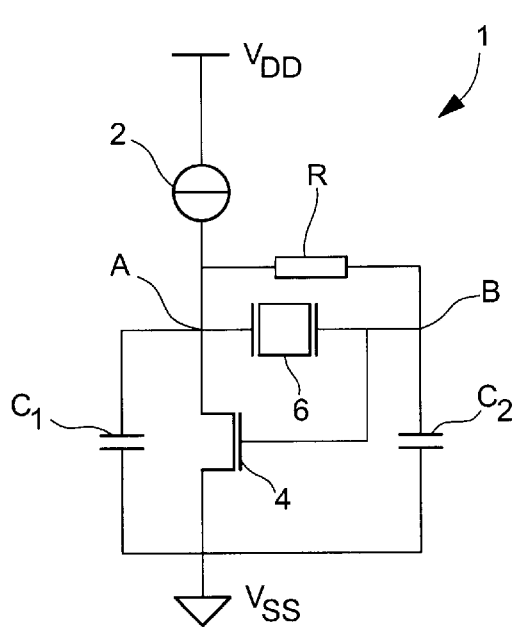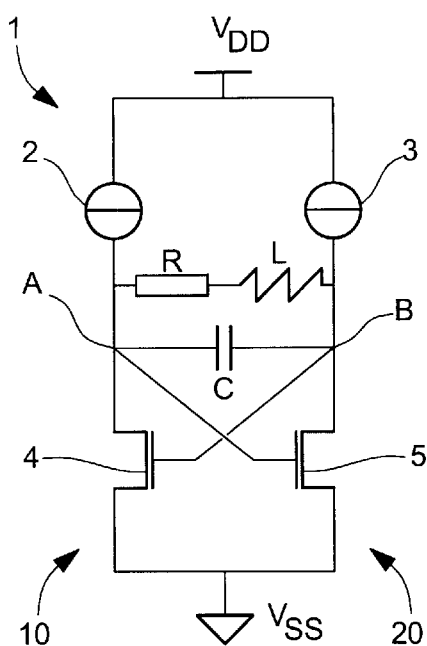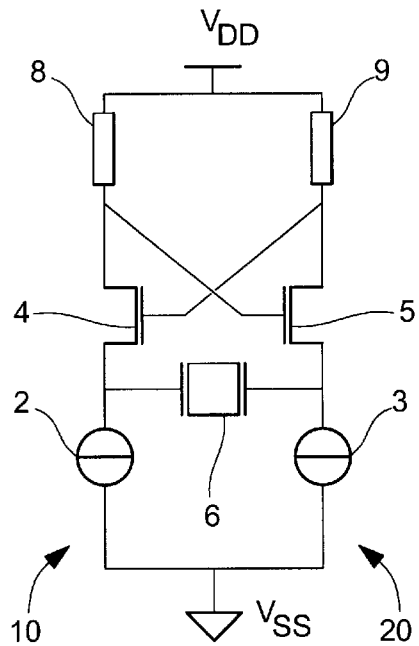
Fig.1a
PRIOR ART
Fig.1b
PRIOR ART
Fig.1c
PRIOR ART

DIFFERENTIAL OSCILLATOR CIRCUIT INCLUDING AN ELECTRO-MECHANICAL RESONATOR

BACKGROUND OF THE INVENTION

The present invention generally concerns a differential oscillator circuit including an electromechanical resonator, in particular for an application as a timekeeper or in the field of telecommunications.

Oscillator circuits are used in two main application categories. One of these applications is as a timekeeper or clock signal generator and the other is as a circuit for making signal frequency translation possible in telecommunication devices.

Electro-mechanical resonators, such as quartz resonators, are used, so to speak, systematically in applications as time-keeper, requiring a precise time base, whereas the oscillator circuits used in radio-transmitters generally use LC tank circuits. There is no substantial difference in the circuits associated with these two types of resonators.

FIG. 1a shows a low consumption oscillator circuit 1 including a quartz resonator typically used in applications as time-keeper. This oscillator circuit 1, also known as a Colpitts oscillator circuit, thus includes a branch including a series arrangement, starting from a supply potential VDD to a supply potential VSS forming earth, from a current source 2 and a MOS transistor 4 connected via its drain terminal to current source 2 and via its source terminal to potential VSS. A quartz resonator 6 and a resistive element R are connected in parallel between the connection node, indicated by the reference A, of current source 2 and transistor 4, and the connection node, indicated by the reference B, connected to the gate terminal of transistor 4. First and second charge capacitive elements C1 and C2 are respectively connected, via one of their electrodes, to connection nodes A and B, the other electrode being connected to supply potential VSS.

FIG. 1b shows a differential version of a similar oscillator circuit to the circuit of FIG. 1a. In this example, the circuit uses an LC tank circuit. This oscillator circuit, also globally indicated by the reference numeral 1, includes, placed in parallel between supply potentials VDD and VSS, first and second branches 10, 20 each including a series arrangement of a current source 2, respectively 3, and a transistor 4, respectively 5, connected by its drain terminal to the current source and via its source terminal to potential VSS. The LC tank circuit includes a capacitive element C placed in parallel to the series arrangement of a resistive element R, generally symbolising the arrangement losses, and an inductive element L.

Transistors 4 and 5 are connected in a differential configuration so as to form a crossed pair, i.e. the gate terminal of each transistor is connected to the drain terminal of the other transistor. Connection node A is thus formed of the connection node between current source 2, the drain terminal of transistor 4 and the gate terminal of transistor 5, and connection node B is formed of the connection node between current source 3, the drain terminal of transistor 5 and the gate terminal of transistor 4. The LC tank circuit is thus placed, in a similar manner to the quartz resonator of FIG. 1a, between connection nodes A and B of the oscillator circuit, on the side of the drain terminals of transistors 4 and 5.

The differential structure of FIG. 1b offers substantial advantages for high frequency applications, such as, particularly, reduced sensitivity to the supply and substrate noise, reduced harmonic pair content and limited substrate current injection.

It should be mentioned that the circuit of FIG. 1b cannot be used as such with an electromechanical resonator, such as a quartz resonator, since this circuit would exhibit, in such case, instability of the continuous DC component, except if a path with low ohmic value existed at low frequency between the drain terminals of the transistors such as in the parallel LC tank circuit configuration.

Differential oscillator circuit embodiment attempts using an electro-mechanical resonator have been proposed but have not, as yet, led to satisfactory solutions, mainly for reasons of stability. FIG. 1c shows, for example, the prototype of a differential oscillator circuit employing a quartz resonator developed for the first electronic Swiss watch.

This circuit prototype includes two identical branches 10, 20 each including, starting from the supply potential VDD to the supply potential VSS, the series arrangement of a resistive element 8, respectively 9, of an n-MOS transistor 4, respectively 5, and a current source 2, respectively 3. The quartz resonator 6 is connected on the side of the source terminals of transistors 4 and 5 and, in a similar way to the circuit of FIG. 1b, transistors 4 and 5 are connected in a differential configuration, the gate terminal of each transistor being connected to the drain terminal of the other transistor.

As already mentioned, making the differential oscillator circuit of FIG. 1c has not been brought to a successful conclusion for reasons of stability.

In addition to the aforementioned oscillator circuits, it will be noted that recent developments in the manufacture of bulk acoustic wave resonators (or BAW resonators), offer new opportunities for applications in the field of telecommunications. Electro-mechanical BAW resonators, and more particularly, thin film BAW resonators have considerable advantages, in particular high working frequencies (of the order of 1 to 10 GHz), a high quality factor, reduced size and the possibility of being integrated directly onto the integrated circuit. By way of complementary information concerning BAW resonators, reference could be made to the document by MM. K. M. Lakin, K. T. McCarron and R. E. Rose, "Solidly Mounted Resonators and Filters", 1995 IEEE Ultrasonics Symposium, pp. 905–908.

The possibilities offered by the aforementioned BAW resonators require the development of dedicated circuits making use of all the advantages and excellent properties of these resonators.

One general object of the present invention is to propose an oscillator circuit which is in particular suited, but not solely, to high frequency applications.

Another object of the present invention is to propose such an oscillator circuit, which also has good stability.

Another more particular object of the present invention is to propose an oscillator circuit able, in particular, to make use of the advantages and excellent properties of the aforementioned BAW resonators.

The present invention thus concerns a differential oscillator circuit including an electromechanical resonator whose features are listed in the independent claim 1.

Advantageous embodiments of the present invention form the subject of the dependent claims.

SUMMARY OF THE INVENTION

According to the invention, the differential oscillator circuit includes, in particular, first and second branches each including a series arrangement of at least a first current source, a transistor connected via its current terminals and resistor means assuring adequate polarisation of the transistors. The transistors are connected, in a similar way to the prior art, in a differential configuration, the control terminal of each transistor being connected to the current terminal of the other transistor having the most positive potential, like the drain terminal of the transistors in the event that the latter are made in MOS technology.

More particularly, according to the invention, the electromechanical resonator is connected between the control terminals of the transistors, namely on the side of the current terminals of the transistors having the most positive potential, like the drain terminals of MOS technology transistors. Moreover, a capacitive element is placed between the current terminals of the transistors having the most negative potential, namely the source terminals of MOS transistors.

The various embodiments, which will be described in the following description, are based on MOS technology. Although not explicitly shown, the dual versions of these embodiments (obtained by reversing the supply voltages and the polarities of the transistors) are also deemed to form part of the invention. Furthermore, it will likewise be understood that the present invention is not limited to this specific technology and that the transistors could, if required, by made in bipolar technology.

The invention proposes, for the first time, an efficient solution relying on an oscillator circuit with a differential structure including an electromechanical resonator. Unlike the differential resonator of FIG. 1c which has a stability problem, the oscillator circuit according to the present invention has great stability and essentially behaves like the oscillator circuit of FIG. 1b in proximity to the resonant frequency of the LC tank circuit. The capacitive element placed on the source side with respect to the crossed pair of transistors fixes the frequency below which the stability of the continuous DC component—or negative counter-reaction—dominates, and above which oscillation occurs.

According to the invention, the current sources can regulate the oscillation amplitude if they are placed in a low frequency regulating loop following an amplitude detector.

From the point of view of consumption, the oscillator circuit according to the present invention performs better than the Colpitts oscillator illustrated in FIG. 1a, since the charge capacitive elements C1 and C2 placed on either side of the Colpitts resonator are omitted, according to the present invention, without modifying the behaviour of the circuit and without being detrimental to frequency stability of the oscillator.

BRIEF DESCRIPTION OF THE DRAWINGS

Other features and advantages of the present invention will appear more clearly upon reading the following detailed description, made with reference to the annexed drawings given by way of non-limiting example and in which:

FIG. 1a, which has already been described, shows a diagram of an oscillator circuit with an electromechanical resonator, known by the name of a Colpitts resonator;

FIG. 1b, which has already been described, shows a diagram of a differential oscillator circuit including an LC tank circuit;

FIG. 1c, which has already been described, shows a diagram of a differential oscillator circuit prototype including an electromechanical resonator envisaged for the first electronic Swiss watch;

FIG. 2 shows a diagram of a differential oscillator circuit, globally indicated by the reference numeral 1, constituting a first embodiment of the present invention.

Figure 2:
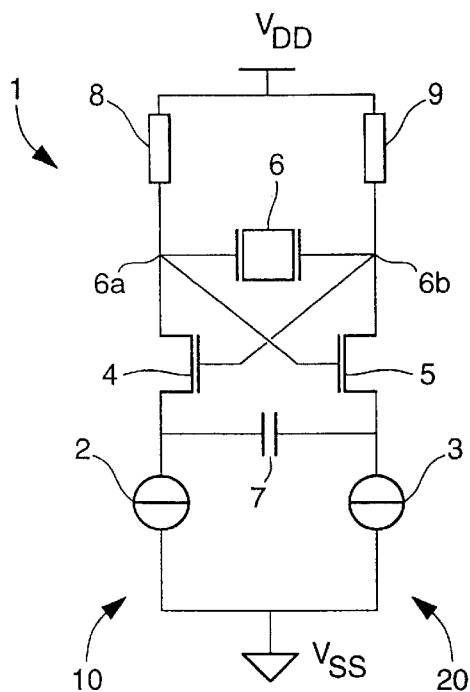
FIG. 2 shows a differential oscillator circuit constituting a first embodiment of the present invention.

This differential oscillator circuit 1 includes, generally, first and second branches, respectively designated by the reference numerals 10 and 20, each connected between a high supply potential VDD and a low supply potential VSS. These branches are identical and each include, starting from high supply potential VDD, the series arrangement of a resistive element 8, respectively 9, an n-MOS transistor 4, respectively 5, and a current source 2, respectively 3. More specifically, one of resistive elements 8, 9 is connected between supply potential VDD and the drain of transistor 4, and the other is connected between supply potential VDD and the drain of transistor 5. Likewise, one of current sources 2, 3 is connected between supply potential VSS and the source of transistor 4, and the other is connected between supply potential VSS and the source of transistor 5.

Transistors 4, 5 form a crossed pair of transistors. In this configuration, the drain of transistor 4 of first branch 10 is connected to the gate of transistor 5 of the other branch 20 and, symmetrically, the drain of transistor 5 of second branch 20 is connected to the gate of transistor 4 of first branch 10.

According to the invention, differential oscillator circuit 1 further includes an electromechanical resonator 6 connected via first and second terminals 6a, 6b between the drains of transistors 4 and 5 of the two branches 10, 20. These first and second terminals 6a, 6b of electromechanical resonator 6 also form the first and second output terminals of the differential oscillator circuit.

EMBODIMENTS OF THE INVENTION.

This electromechanical resonator 6 may be a continuous quartz resonator with high impedance in steady state or, with a view to use for high frequency applications (within a range of the order of 1 to 10 GHz), advantageously a bulk acoustic wave resonator like the BAW resonators mentioned in the preamble or, again, so-called "TFBAR" resonators (Thin Film Bulk Acoustic Resonators).

Differential oscillation circuit 1 according to the invention further includes a capacitive element 7 connected between the sources of transistors 4, 5. This capacitive element 7 fixes the frequency below which the DC stabilisation (or negative counter-reaction) dominates and above which oscillation can occur, Generally, and as will be seen in detail hereinafter with reference to the second embodiment of the present invention, current sources 2, 3 can allow regulation of the oscillation amplitude if the oscillations are placed in a suitable oscillation amplitude regulating loop.

As already mentioned in the preamble, the structure illustrated in FIG. 2 (and the structures which will be discussed hereinafter with reference to FIGS. 3 and 5) perform better in terms of power consumption than the Colpitts oscillator circuit illustrated in FIG. 1a. Indeed, the use of charge capacitive elements on either side of the electromechanical resonator can be omitted without altering the behaviour or frequency stability of the oscillator.

Figure 3:
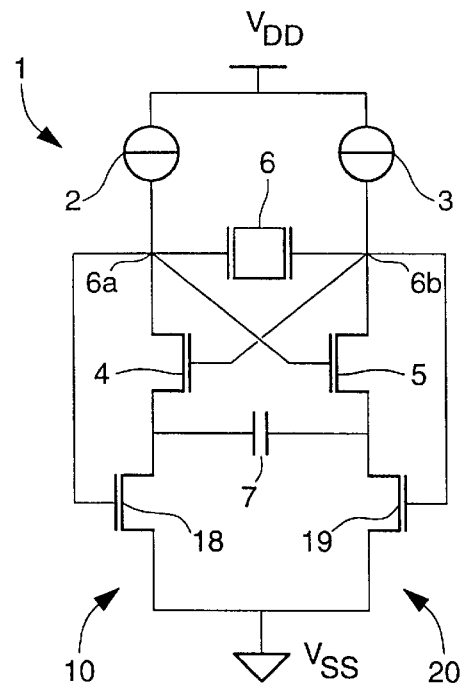
FIG. 3 shows a differential oscillator circuit constituting a second embodiment of the present invention.

FIG. 3 shows a diagram of a differential oscillator circuit, also indicated by the reference numeral 1, constituting a second embodiment of the present invention. The elements common to this embodiment and the preceding embodiment are indicated by the same reference numerals.

In a similar manner to the circuit of FIG. 2, this differential oscillator circuit includes two identical branches 10, 20 each including a series arrangement, between potentials VDD and VSS, of a current source 2, 3, an n-MOS transistor 4, 5 and resistor means (transistors 18 and 19).

Electro-mechanical resonator 6 and capacitive element 7 are connected as previously on either side of the crossed transistor pair 4, 5, resonator 6 on the drain side and capacitive element 7 on the source side.

The structure of FIG. 3 differs from the first embodiment of FIG. 2 in that current sources 2, 3 are connected between supply potential VDD and the drains of transistors 4, 5 of the crossed pair. The resistor means are each formed of an n-MOS transistor 18, 19 connected via its drain to the source of the corresponding transistor of the crossed pair 4, 5 and via its source to supply potential VSS. The gates of these transistors 18, 19 are respectively connected to the drains of transistors 4, 5 of the crossed pair. It will be understood that transistors 18, 19, thus behave like variable resistors whose values are controlled by the voltage present at the drains of the crossed pair of transistors. Operationally, these transistors 18, 19 play a similar role to the role fulfilled by resistive elements 8 and 9 of the embodiment of FIG. 2.

The structure of the oscillator circuit of FIG. 3 is, however, more advantageous than the structure illustrated in FIG. 2 in the sense that it does not require the use of prior resistive elements to assure suitable polarisation of the transistors. Consequently, this structure can be operated at a lower voltage and is less sensitive to the supply noise. Moreover, since the common mode voltage of this transistor does not depend substantially on the current passing through the transistors, the start time can be reduced and the offset voltage, resulting from the transistor mismatch, at the resonator terminals, can be lowered.

As will now be seen, another advantage of the structure of the oscillator circuit of FIG. 3 lies in the fact that an amplitude regulating loop can easily be designed and in the fact that a preliminary divider circuit, also called a prescaler, having the same common mode, can be used to make the first division stages of the oscillator.

Figure 4:
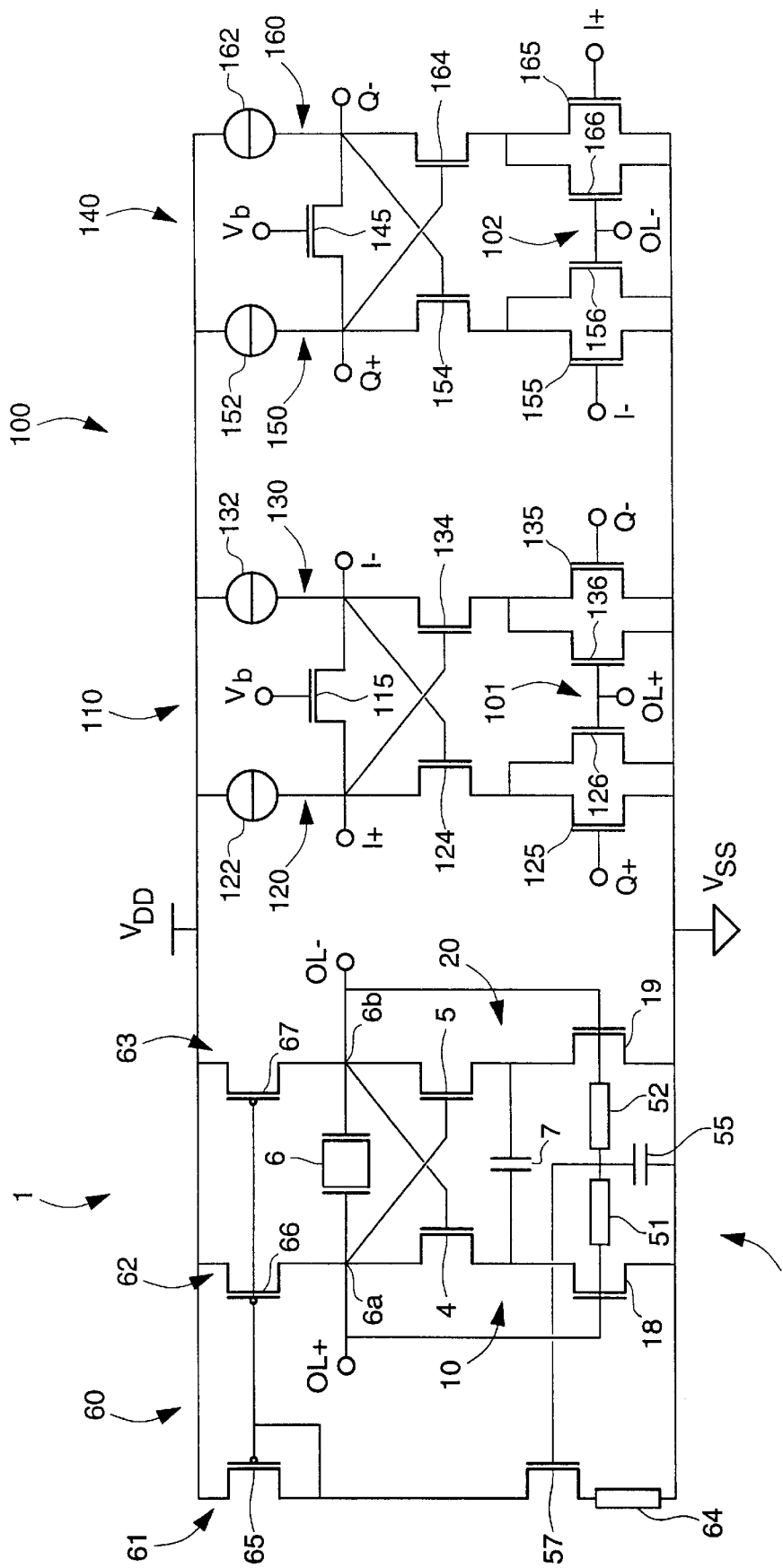
FIG. 4 shows a diagram of a circuit including a differential oscillator circuit according to the second embodiment of the present invention fitted with an amplitude regulating loop and the first stage of a preliminary divider circuit, or prescaler, in particular for generating in-phase quadrature signals 1, Q.

FIG. 4 thus shows a diagram of a complete oscillator based on the second embodiment of FIG. 3 and including, as a complement, an oscillation amplitude regulating loop as well as the first stage of a preliminary divider circuit, or prescaler, allowing in-phase quadrature signals 1, Q to be produced. This circuit is particularly intended for an application in the telecommunications field.

The amplitude regulating loop, globally designated by the reference numeral 50, is connected to each of the terminals 6a, 6b of electromechanical resonator 6 and delivers a signal allowing the current from current sources 2, 3 of the two branches 10, 20 of oscillator circuit 1 to be enslaved. These current sources are made conventionally by means of a current mirror, designated 60, including, in this example, a reference branch 61, including a resistive element 64 in series with a first p-MOS transistor 65 whose gate and drain are connected to each other, and two output branches 62, 63 connected to first and second branches 10 and 20 of oscillator circuit 1 and each including a p-MOS transistor 66, 67 connected to the drain of the corresponding transistor of the crossed transistor pair 4, 5.

More specifically, the regulating loop includes, in particular, two resistive elements 51, 52 connected in series between terminals 6a, 6b of resonator 6 and a capacitive element 55 connected between the connection node of resistive elements 51, 52 and low supply potential VSS. The voltage present at the connection node of resistive elements 51, 52 is applied to the gate of an n-MOS transistor 57 connected, via its source and drain terminals, in this example, between resistive element 64 and p-MOS transistor 65 of reference branch 61 of the current mirror.

Thus, the oscillation amplitude, on which the oscillator common mode voltage depends, is extracted by means of resistive elements 51, 52 in order to polarise transistor 57 which determines the current passing through reference branch 61 of the current mirror and images of which are reproduced in branches 10, 20 of oscillator circuit 1. Consequently, as soon as the oscillation amplitude increases, the current passing through each branch of the oscillator is reduced until a stable point is reached.

For a low frequency implementation, lower than several tens of MHz, the two resistive elements 51, 52 used to extract the common mode voltage can be made by means of four poly back-to-back diodes, or conduction MOS transistors, so that their conductance remains well below the equivalent parallel conductance of electro-mechanical resonator 6. In such case, the filter pole is not controlled properly so that this solution should be discarded in the event that the oscillator, used as a reference oscillator in a radio-frequency transmitter and/or receiver, is activated and deactivated intermittently in order to save energy. In conventionally encountered architectures, the time base is generally fitted with a low frequency quartz resonator (typically 32 kHz), which operates permanently and consumes considerably less power than the reference radio oscillator. The expected improvement in terms of power consumption with the differential oscillator circuit according to the present invention would advantageously allow this quartz resonator at 32 kHz to be omitted and, consequently, reduce manufacturing costs and improve efficiency.

The first stage of the prescaler is globally indicated by the reference numeral 100 and includes two identical interconnected structures 110 and 140, very similar to the structure of differential oscillator circuit 1 presented hereinbefore. This arrangement forms a relaxation oscillator circuit. This first stage 100 includes two inputs 101 and 102 to which the output terminals 6a, 6b of differential oscillator circuit 1 are connected. Generally, inputs 101, 102 of the divider synchronise the relaxation oscillator by alternately locking each of structures 110 and 140 for half an oscillation period.

More specifically, each structure 110, 140 includes two identical branches 120, 130 and 150, 160 each connected between high supply potential VDD and low supply potential VSS. Each branch includes the series arrangement, starting from supply potential VDD, of a current source 122, 132, 152, 162, a first n-MOS transistor 124, 134, 154, 164, connected via its drain terminal to the current source, and second and third n-MOS transistors 125, 135, 155, 165, respectively 126, 136, 156, 166, both connected via their drain terminal to the source terminal of the first transistor and via their source terminal to the low supply potential VSS.

In each structure, the first transistors 124 and 134, respectively 154 and 164 are connected in a differential configuration to form a crossed pair in a similar manner to differential circuit 1, the gate terminal of each of these transistors being thus connected to the drain terminal of the other transistor of the crossed pair.

Moreover, the gate terminals of the third transistors 126 and 136, respectively 156 and 166 of each structure 110, 140 are connected to each other and respectively form the first 101 and second 102 input terminals of prescaler divider circuit 100.

The prescaler delivers at its outputs in-phase quadrature signals designated I+, I−, Q+, Q−, where I− and Q−− respectively designate the opposition signals of in-phase quadrature signals I+ and Q+. More particularly, signals I+ and Q+ are respectively delivered on the drain terminal of transistor 124 of first branch 120 of first structure 110 and on the drain terminal of transistor 154 of first branch 150 of second structure 140. Their opposition signals I− and Q− are delivered on the drain terminal of the other transistor of the corresponding crossed pair.

The two structures 110 and 140 are also interconnected so that signal I+ and its opposition signal I−, delivered on the drain terminals of transistors 124, 134 of first structure 110, are respectively applied on the gate terminals of transistors 165 and 155 of second structure 140, namely signal I+on the gate of transistor 165 and signal I− on the gate of transistor 155. Likewise, signal Q+ and its opposition signal Q−, delivered on the drain terminals of transistors 154 and 164 of second structure 140, are respectively applied on the gates of transistors 125 and 135 of first structure 110. For the sake of simplicity, these interconnections have not been shown in FIG. 4, the latter being simply identified by the reference of the signal applied on the terminals concerned. The same is true also of the interconnection between the output terminals 6a, 6b of differential oscillator circuit 1, which are applied on the input terminals 101, 102 of prescaler 100, this interconnection being identified by the references OL+ and OL−.

Each structure 110, 140 further includes a fourth transistor 115, respectively 145 connected via its source and drain terminals between the drain terminals of the crossed transistor pair. The voltage Vb applied on the gate terminal of this fourth transistor fixes the output amplitude of the in-phase quadrature signals. This voltage Vb allows the oscillation amplitude to be reduced and thus considerably reduces power consumption, this amplitude being able to be gradually increased over the stages so that the signal amplitude reaches the rail levels after a certain number of stages in order to assure proper coupling to conventional logic divider circuits. According to an alternative embodiment, fixed resistors replace transistors 115 and 145.

Generally, owing to the structure of the oscillator and the divider, all the stages can be coupled directly since the common output mode of each stage is used as polarisation at the input of the following stage.

Figure 5:
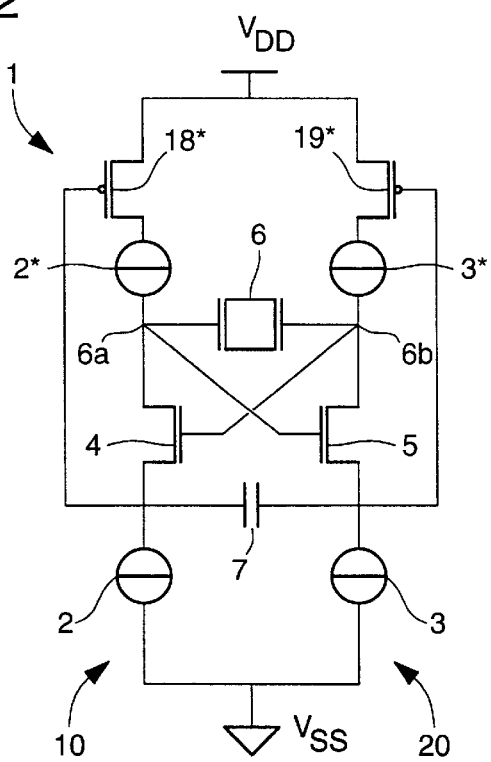
FIG. 5 shows a differential oscillator circuit constituting a third embodiment of the present invention.

FIG. 5 shows a diagram of a differential oscillator circuit, also indicated by the reference numeral 1, forming a third embodiment of the present invention. The elements common to this embodiment and to the preceding embodiments are indicated by the same reference numerals.

Like the preceding embodiments, this differential oscillator circuit includes two identical branches 10, 20 each including the series arrangement, between potentials VDD and VSS, of a current source 2, 3, an n-MOS transistor 4, 5 and resistor means (transistors 18* and 19*). The arrangement of electromechanical resonator 6, capacitive element 7 and transistors 4, 5 forming the crossed pair again remains unchanged.

The structure of FIG. 5 differs from the second embodiment of FIG. 3, first of all, in that current sources 2, 3 are connected between supply potential VSS and the sources of the crossed pair of transistors 4, 5. The resistor means are each formed of a p-MOS transistor 18*, 19* connected, via its drain (via an additional current source 2*, 3*) to the drain of the corresponding transistor of the crossed pair and, via its source to supply potential VDD. The gates of these transistors 18*, 18* are respectively connected to the sources of the crossed pair of transistors 4, 5. Their role is similar to the role fulfilled by n-MOS transistors 18 and 19 of the embodiment of FIG. 3. Finally, an additional current source 2*, respectively 3*, is connected between output node 6a, respectively 6b, and the drain of p-MOS transistor 18*, respectively 19*.

By way of variant, the gates of transistors 18*, 19* can alternately be connected to the drains of the crossed pair of transistors 4, 5. This connection would, however, be made with the detriment of an increase in the minimum supply voltage.

Also by way of advantageous variant, the differential oscillator circuit of FIG. 5 can be fitted with capacitive attenuation means assuring linearisation of the crossed pair of transistors.

Figure 6A:
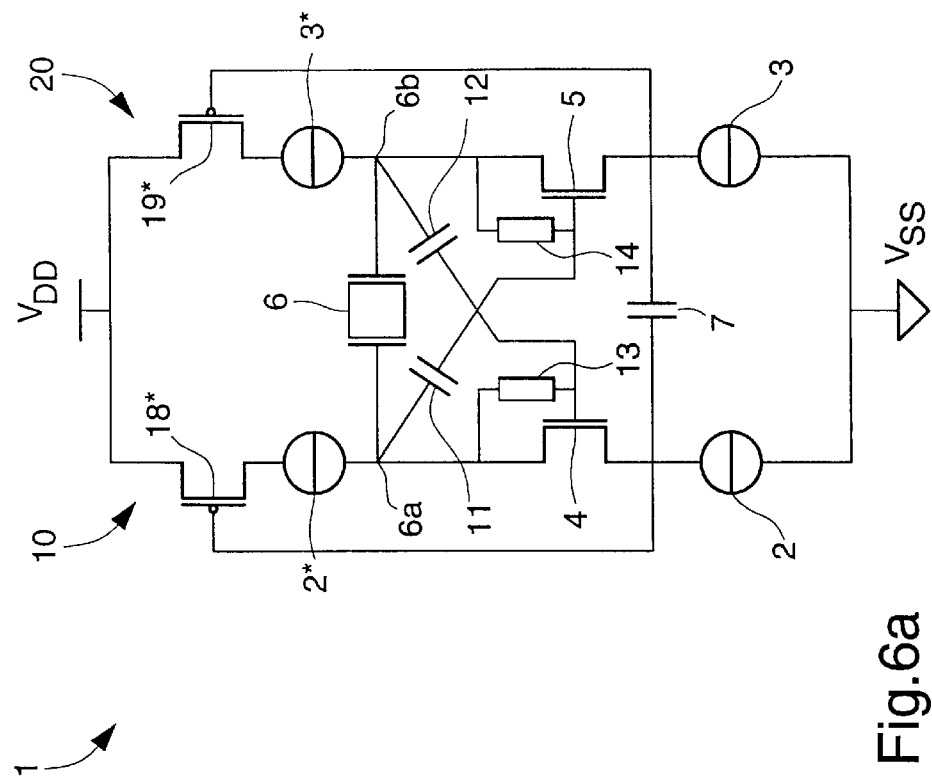
FIGS. 6a and 6b show two variants of the third embodiment of the present invention fitted with capacitive attenuation means placed on the crossed pair of transistors allowing linearisation of the features of said transistors.
Figure 6B:
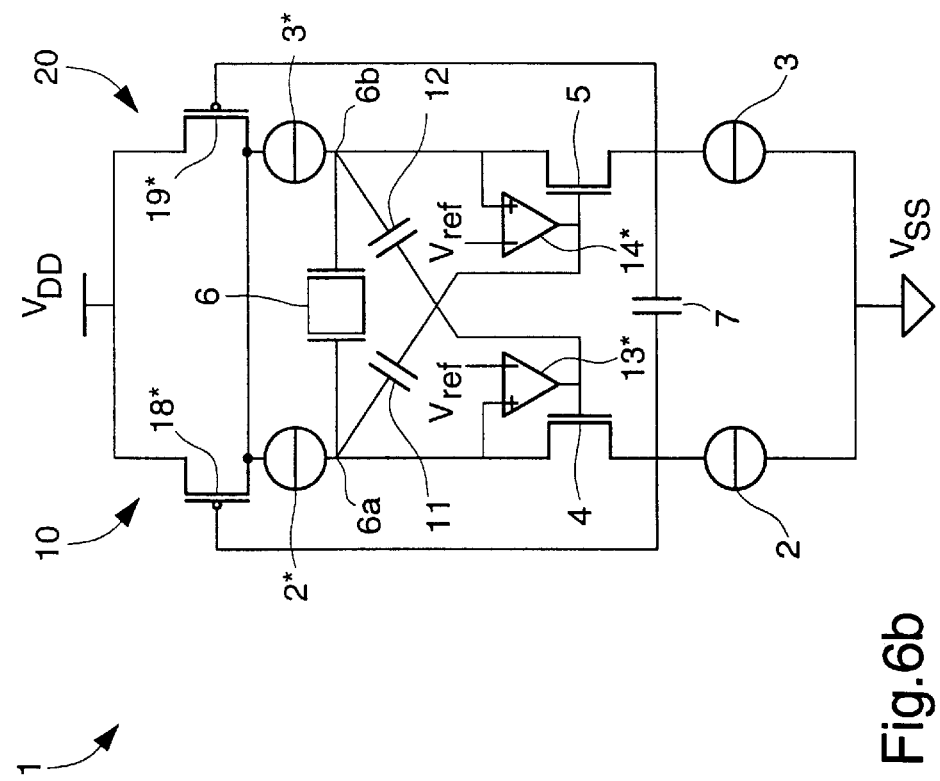

FIGS. 6a and 6b thus illustrate two variants of the differential oscillator circuit of FIG. 5 fitted with capacitive attenuation means placed on the crossed pair of transistors.

FIG. 6a shows a first variant wherein two capacitive elements 11, 12 are respectively arranged on the drain-gate connection of the crossed pair of transistors 4, 5, namely between the gate terminal of transistor 4 and the drain terminal of transistor 5, and between the gate terminal of transistor 5 and the drain terminal of transistor 4.

According to this first variant, the polarisation of the gate of the crossed pair of transistors 4, 5, is assured by a simple resistive element 13, respectively 14, connected between the drain and gate terminals of the same transistor of the crossed pair, as illustrated.

FIG. 6b shows a second more advantageous variant wherein each resistive element 13, 14 is replaced by an amplifier 13*, 14* whose non-inverting input is connected to the drain terminal of transistor 4, respectively 5, of the crossed pair, the output of this amplifier being applied on the gate terminal of the corresponding transistor. The other, non-inverting, input, of amplifier 13*, 14* is fixed to a reference voltage Vref. Consequently, the drain voltage of transistors 4, 5 of the crossed pair, will take the value of the other input of the amplifier, namely voltage Vref, independently of the gate voltage of the transistor which is adjusted by the amplifier. Moreover, in this second variant, the drains of p-MOS transistors 18* and 19* are connected to each other.

It will be understood that various modifications and/or improvements obvious to those skilled in the art can be made to the embodiment described in the present description without departing from the scope of the invention defined by the annexed claims. Thus, as already mentioned, the differential oscillator circuit according to the present invention could perfectly well be made in bipolar technology.

What is claimed is:

1. A differential oscillator circuit including first and second branches each connected between a high supply potential and a low supply potential, said first branch including, arranged in series:
   a first transistor having a control terminal, a first current terminal placed on the side of said high supply potential and a second current terminal placed on the side of said low supply potential; and
   at least a first current source connected between the first current terminal of said first transistor and said high supply potential,
   said second branch including, arranged in series:
   a second transistor having a control terminal, a first current terminal placed on the side of said high supply potential and a second current terminal placed on the side of said low supply potential; and
   at least a second current source connected between the first current terminal of said second transistor and said high supply potential
   said first and second transistors being connected in a differential configuration, the first current terminal of the first transistor, respectively of the second transistor, being connected to the control terminal of the second transistor, respectively of the first transistor,
   wherein said differential oscillator circuit further includes:
   an electro-mechanical resonator connected via first and second terminals between the first current terminal of the first transistors and the first current terminal of the second transistor, said first and second terminals of the electro-mechanical resonator forming first and second output terminals of the differential oscillator circuit; and
   a capacitive element connected between the second current terminals of the first transistors and the second current terminal of the second transistor,
   wherein said first branch further includes a third transistor with a control terminal, a first current terminal and a second current terminal respectively connected to the first current terminal of said first transistor, to the second current terminal of said first transistor and to said low supply potential,
   and wherein said second branch further includes fourth transistor with a control terminal, a first current terminal and a second current terminal respectively connected to the first current terminal of said second transistor, to the second current terminal of said second transistor and to said low supply potential.

2. The differential oscillator circuit according to claim 1, further including an amplitude regulating loop connected to the terminals of said electro-mechanical resonator to enslave the current delivered by the first and second current sources,
   said amplitude regulating loop including two resistive elements connected in series between the terminals of said electro-mechanical resonator and a capacitive element connected between the connection node of said resistive elements and said low supply potential, the voltage present at the connection node of said resistive elements controlling regulating means for the current delivered by the first and second current sources.

3. The differential oscillator circuit according to claim 2, wherein said first and second current sources are made using a current mirror including a reference branch and first and second output branches respectively connected to said first and second branches of the oscillator circuit, and wherein said regulating means is a transistor connected in series via its current terminals in said reference branch of the current mirror and whose control terminal is connected to said connection node of said resistive elements.

4. The differential oscillator circuit according to claim 1, further including a prescaler for generating in-phase quadrature signals,
   said prescaler including at least first and second identical interconnected structures forming a relaxation oscillator circuit,
   said prescaler including first and second inputs respectively connected to the first and second output terminals of the differential oscillator circuit.

5. The differential oscillator circuit according to claim 4, wherein each structure of said prescaler includes first and second branches each connected between said high supply potential and said low supply potential, the first branch of each structure including, arranged in series:
   a fifth transistor having a control terminal, a first current terminal placed on the side of said high supply potential and a second current terminal placed on the side of said low supply potential,
   a third current source connected between said high supply potential and said first current terminal of the fifth transistor;
   a sixth transistor having a control terminal, a first current terminal connected to the second current terminal of said fifth transistor, and a second current terminal connected to said low supply potential; and
   a seventh transistor having a control terminal, a first current terminal connected to the second current terminal of said fifth transistor, and a second current terminal connected to said low supply potential,
   the second branch of each structure including, arranged in series:
   an eighth transistor having a control terminal, a first current terminal placed on the side of said high supply potential and a second current terminal placed on the side of said low supply potential,
   a fourth current source connected between said high supply potential and said first current terminal of the eighth transistor;
   a ninth transistor having a control terminal, a first current terminal connected to the second current terminal of said eighth transistor, and a second current terminal connected to said low supply potential; and
   a tenth transistor having a control terminal, a first current terminal connected to the second current terminal of said eighth transistor, and a second current terminal connected to said low supply potential,
   said fifth and eighth transistors of each structure being connected in a differential configuration, the first current terminal of the fifth transistor, respectively of the eighth transistor, being connected to the control terminal of the eighth transistor, respectively of the fifth transistor,
   said control terminals of the seventh and tenth transistors of the first structure, respectively of the second structure, being connected to each other and forming said first input, respectively said second input, of the prescaler,
   said control terminal of the sixth transistor, respectively of the ninth transistor, of the first structure being connected to the first current terminal of the fifth transistor, respectively of the eighth transistor, of the second structure, said control terminal of the sixth transistor, respectively of the ninth transistor, of the second structure being connected to the first current terminal of the eighth transistor, respectively of the fifth transistor, of the first structure, each structure further including resistor means connected via first and second current terminals between the first current terminals of the fifth and eighth transistors of each structure.

6. The differential oscillator circuit according to claim 1, wherein said electro-mechanical resonator is a high impedance resonator when in steady state.

7. The differential oscillator circuit according to claim 1, wherein said electro-mechanical resonator is a bulk acoustic wave resonator.

8. A differential oscillator circuit including first and second branches each connected between a high supply potential and a low supply potential, said first branch including, arranged in series:

a first transistor having a control terminal, a first current terminal placed on the side of said high supply potential and a second current terminal placed on the side of said low supply potential; and at least a first current source connected between the second current terminal of said first transistor and said low potential, said second branch including, arranged in series:

a second transistor having a control terminal, a first current terminal placed on the side of said high supply potential and a second current terminal placed on the side of said low supply potential; and at least a second current source connected between the second current terminal of said second transistor and said low potential, said first and second transistors being connected in a differential configuration, the first current terminal of the first transistor, respectively of the second transistor, being connected to the control terminal of the second transistor, respectively of the first transistor, wherein said differential oscillator circuit further includes:

an electro-mechanical resonator connected via first and second terminals between the first current terminal of the first transistor and the first current terminal of the second transistor, said first and second terminals of the electro-mechanical resonator forming first and second output terminals of the differential oscillator circuit; and a capacitive element connected between the second current terminal of the first transistor and the second current terminal of the second transistor, wherein said first branch further includes a third transistor with a control terminal, a first current terminal and a second current terminal respectively connected to the first or second current terminal of said first transistor, to said high supply potential and to the first current terminal of said first transistor through a third current source, and wherein said second branch further includes a fourth transistor with a control terminal, a first current terminal and a second current terminal respectively connected to the first or second current terminal of said second transistor, to said high supply potential and to the first current terminal of said second transistor through a fourth current source.

9. The differential oscillator circuit according to claim 8, wherein the control terminal of the first transistor, respectively of the second transistor, is connected to the first current terminal of the second transistor, respectively of the first transistor, by means of a capacitive element, and wherein each branch of said differential oscillator circuit further includes a resistive element connected between the first current terminal and the control terminal of said first, respectively second, transistor.

10. The differential oscillator circuit according to claim 8, wherein the control terminal of the first transistor, respectively of the second transistor, is connected to the first current terminal of the second transistor, respectively of the first transistor, by means of a capacitive element, and wherein each branch of said differential oscillator circuit further includes an amplifier including first and second input terminals respectively connected to the first current terminal of said first, respectively second, transistor and to a reference voltage, the output of said amplifier being applied on the control terminal of said first, respectively second, transistor.

11. The differential oscillator circuit according to claim 8, wherein said electro-mechanical resonator is a high impedance resonator when in steady state.

12. The differential oscillator circuit according to claim 8, wherein said electro-mechanical resonator is a bulk acoustic wave resonator.

* * * * *